United States Patent [19]
Otsuki et al.

[11] 4,301,464
[45] Nov. 17, 1981

[54] LEAD FRAME AND SEMICONDUCTOR DEVICE EMPLOYING THE SAME WITH IMPROVED ARRANGEMENT OF SUPPORTING LEADS FOR SECURING THE SEMICONDUCTOR SUPPORTING MEMBER

[75] Inventors: Keizo Otsuki, Higashiyamato; Hidetoshi Mochizuki, Fuchu; Akira Suzuki, Ohme; Yoshio Adachi; Hideki Kosaka, both of Kodaira; Gen Murakami, Machida, all of Japan

[73] Assignee: Hitachi, Ltd., Tokyo, Japan

[21] Appl. No.: 55,070

[22] Filed: Jul. 5, 1979

[30] Foreign Application Priority Data

Aug. 2, 1978 [JP] Japan ............................ 53/93607

[51] Int. Cl.³ ............... H01L 23/48; H01L 29/44; H01L 29/52
[52] U.S. Cl. ............................ 357/70; 357/72; 357/68

[58] Field of Search ................... 357/70, 72, 68

[56] References Cited

U.S. PATENT DOCUMENTS

| 3,842,492 | 10/1974 | Kamerbeek | 357/70 |
| 3,926,746 | 12/1975 | Hargis | 357/70 |
| 4,023,053 | 5/1977 | Shimizu et al. | 357/70 |
| 4,109,096 | 8/1978 | Dehaine | 357/70 |
| 4,138,691 | 2/1979 | Bonkohara et al. | 357/70 |

FOREIGN PATENT DOCUMENTS 1383297  2/1975  United Kingdom ............... 357/70

*Primary Examiner*—Andrew J. James
*Attorney, Agent, or Firm*—Craig and Antonelli

[57] ABSTRACT

This invention relates to a lead frame which is applied to a resin-molded semiconductor device. According to the lead frame of this invention, a quadrangular tab for supporting a semiconductor pellet is supported by four tab leads which extend along diagonal lines of the tab.

15 Claims, 11 Drawing Figures

LEAD FRAME AND SEMICONDUCTOR DEVICE EMPLOYING THE SAME WITH IMPROVED ARRANGEMENT OF SUPPORTING LEADS FOR SECURING THE SEMICONDUCTOR SUPPORTING MEMBER

BACKGROUND OF THE INVENTION

This invention relates to a lead frame and a resin-molded semiconductor device employing such a lead frame.

Metallic lead frames are often used for the assemblage of resin-molded semiconductor devices. The lead frame is formed in such a way that a thin metal plate is punched with a press or etched. FIG. 1 shows a prior-art lead frame formed by this method which is suitable for a semiconductor device of high packaging density. This lead frame is composed of a rectangular tab 2 for mounting a semiconductor element, tab leads 3 which support the tab 2, a plurality of leads 4 which extend to near the peripheral edge of the tab 2, a rectangular frame portion 5 which supports the leads 4 and the tab leads 3, and a dam piece 6 which joins the frame portion 5, the leads 4 and the tab leads 3 together and which prevents the outflow of a resin dissolving during the resin-molding operation. Further, guide holes 7 are provided at fixed intervals along both the side edges of the frame portion 5. For assemblage or transportation which employs the lead frame, the guide holes 7 are used as locating holes or as engaging and transferring holes.

In assembling the semiconductor device with such lead frame, the semiconductor element 1 is mounted on the tab 2, whereupon electrodes of the semiconductor element 1 and the inner ends of the leads 4 corresponding thereto are connected by wires 8. Thereafter, a region inside the dam piece 6 arranged on the rectangular frame portion 5 is molded with the resin so as to cover the semiconductor element 1 etc. with a molding portion 9. Subsequently, the dam piece 6 and the frame portion 5 are cut off to obtain the semiconductor device having flat leads. Also, in order to obtain deal-in-line type semiconductor devices, the leads 4 which protrude from the molding portion 9 are bent halfway.

In the semiconductor device utilizing the lead frame, problems to be stated below have been found by the inventors.

For example, the tab is low in strength because of the structure in which both its sides are supported by the two fine tab leads. Especially, in order to keep the size small in spite of recent trends to increase the number of leads, the widths of the leads (tab leads) cannot avoid becoming small. In order to narrow the leads (to widths of, for example, 0.3 mm), a material for forming the lead frame is made thinner from the viewpoint of punching. By way of example, the thickness of the lead frame is approximately 0.15 mm. As a result, the tab is easily inclined or lifted even by a slight external force applied to the leads, and this constitutes a hindrance to the assemblage. For example, the semiconductor element is mounted on the tab of the lead frame by rubbing by the use of a semiconductor element-adsorbing jig such as collet. For this reason, the tab swings due to oscillations of the rubbing, and the semiconductor element and the tab are imperfectly bonded. This results in the problem that the semiconductor element cracks when pushed by the flow of the resin during the resin-molding. Moreover, under the operating state of the semiconductor device, a thermal stress acts between a part in which the semiconductor element and the tab are perfectly bonded and a part in which they are imperfectly bonded, on account of heat generated from the semiconductor element. This also results in the problem of the appearance of cracks in the semiconductor element. Further, the resin is caused to flow in towards the semiconductor element 1 in the direction of arrow A indicated in FIG. 1. When, at this time, a corner 2a of the tab 2 is slanted downwards or upwards, the tab 2 inclines more in the slanting direction due to the flow of the resin. The tab 2 is also pushed in the direction of arrow B by the resin. This results in the problem of the breaking of the wire interposed between the bonding region of the semiconductor element and the lead or the problem of the contact between the wires. Further, air bubbles remain in or on the molding portion on account of the development of vortices ascribable to the inclination of the tab. This results in the problem that the moisture resisting property degrades or that the external appearance becomes inferior due to hollows.

SUMMARY OF THE INVENTION

An object of this invention is to provide a novel lead frame of excellent rigidity in which a semiconductor element-supporting member (tab) does not move easily during assemblage.

Another object of this invention is to provide a semiconductor device of excellent moisture-resistance and high reliability for the bonding of wires and a semiconductor element by the use of the aforecited lead frame.

In one aspect of performance of this invention, the lead frame is characterized in that the semiconductor element-supporting member (tab) is carried on a frame portion of the lead frame by at least three leads which extend radially.

DESCRIPTION OF THE PREFERRED EMBODIMENTS

Figure 1:
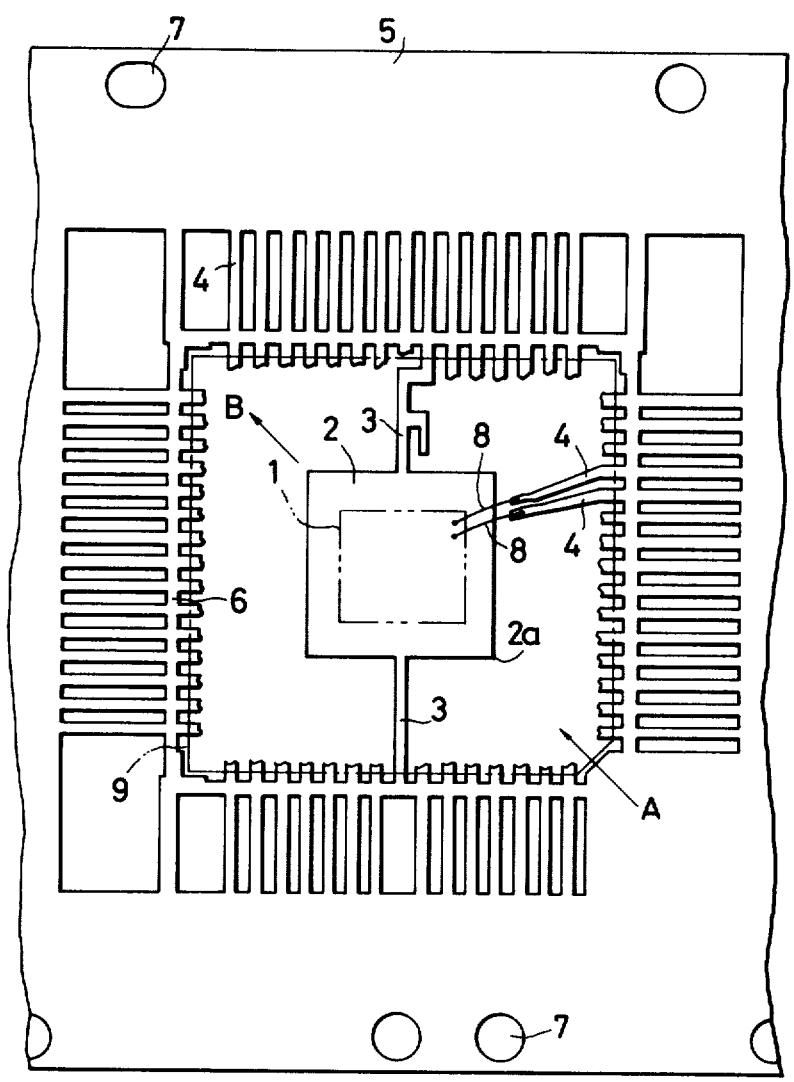
FIG. 1 is a plan view showing a prior-art lead frame.
Figure 2:
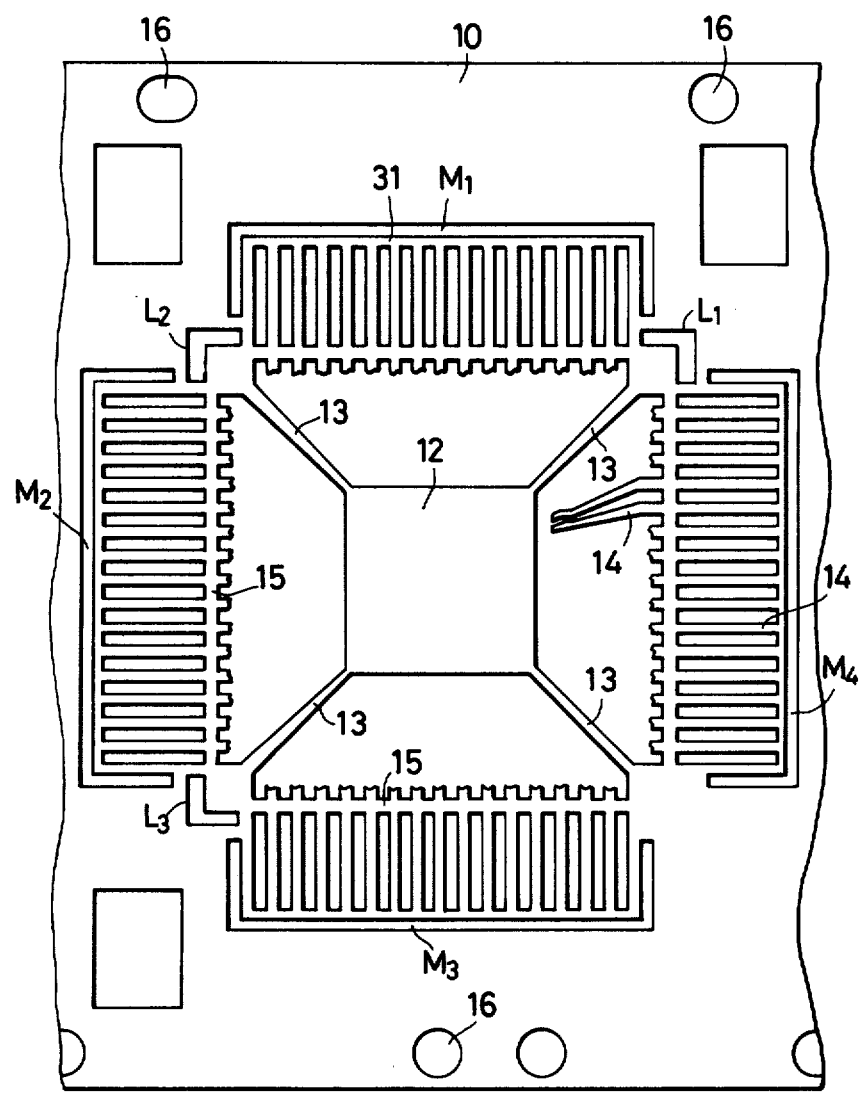
FIG. 2 is a plan view showing an embodiment of a lead frame of this invention.

FIG. 2 is a plan view showing an embodiment of a lead frame of this invention. The lead frame is fabricated by subjecting to punching or etching a metal sheet which is made of an Fe—Ni—Co alloy or an Fe—Ni alloy and which is 0.15 mm thick. The shape of the lead frame is such that a rectangular tab 12 for mounting a semiconductor element (pellet) thereon is located in the center of a frame portion 10 which forms a rectangular frame as a whole though it has different widths in some places. The tab 12 has its four corners coupled to the frame portion 10 by four fine tab leads 13 which extend radially. A plurality of leads 14 extend towards the periphery of the tab 12, that is, a plurality of leads 14 extend towards the four sides of the tab 12. In FIG. 2, only two of the leads 14 extending towards the tab 12 are shown in order to avoid complicated illustration. One end of each of the leads 14 is terminated in the vicinity of the peripheral edge of the tab 12. The other end of each of these leads 14 is coupled with the frame portion 10. In order to check the outflow of a resin having dissolved during resin molding, dam pieces 15 are disposed between the respectively adjacent leads. Further, the frame portion 10 is provided with guide holes 16. L-shaped holes $L_1$, $L_2$ and $L_3$ are provided in those parts of the frame portion 10 which are close to the tab leads 13. Elongate holes $M_1$, $M_2$, $M_3$ and $M_4$ are provided near the other ends of the leads 14. The functional effects of the holes $L_1$-$L_3$ and $M_1$-$M_4$ will be described later. In FIG. 2, the pattern of the lead frame in an area to form one semiconductor device therein is illustrated. In actuality, however, such patterns are formed continuously in a long and narrow shape.

The semiconductor device employing the lead frame thus far described is assembled in the following order.

Figure 3:
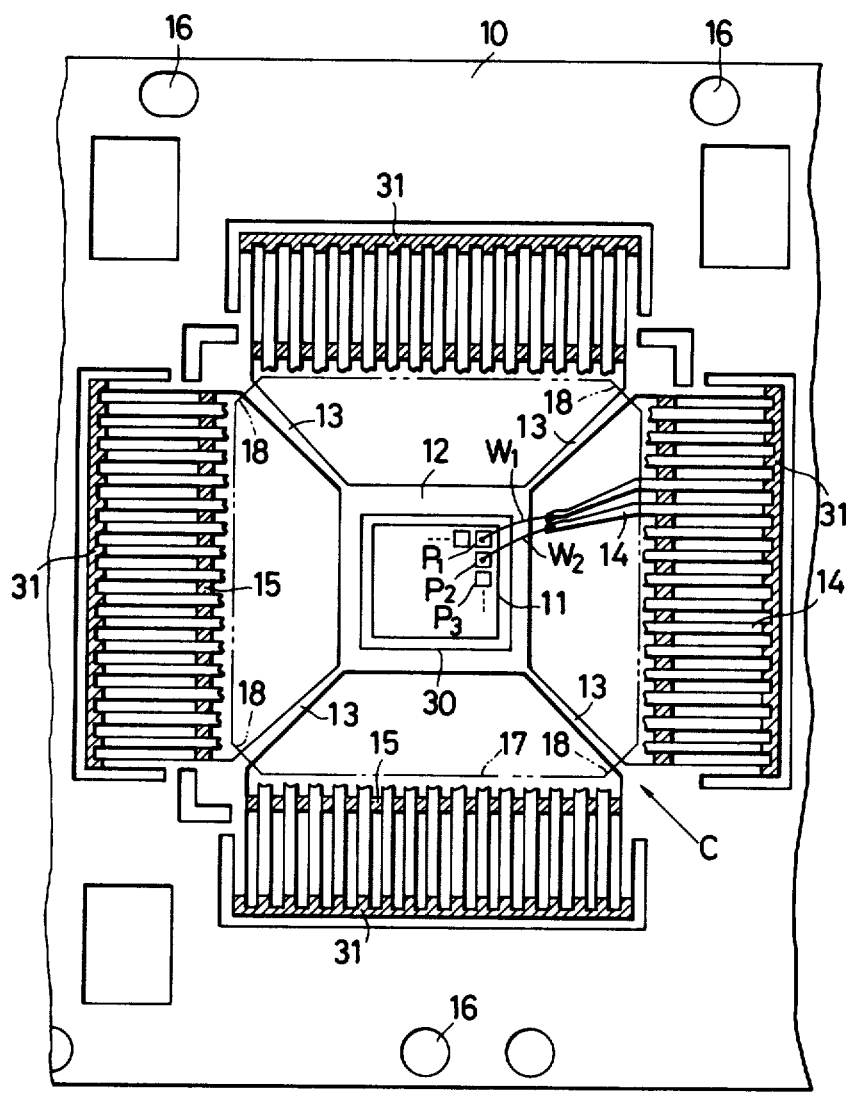
FIG. 3 is a plan view showing an embodiment of a semiconductor device which employs the lead frame of this invention.

First, as illustrated in FIG. 3, the semiconductor element (pellet) 11 is directly bonded onto the tab 12 of the lead frame. This semiconductor element 11 is made of a silicon material, and is formed with a plurality of transistors. In the marginal parts of the surface of the semiconductor element 11, aluminum bonding pads $P_1$, $P_2$ . . . to be connected with the leads 14 of the lead frame by gold (Au) wires are formed to substantially the same number as the number of the leads 14.

In bonding the semiconductor element 11 onto the tab 12, the following method is resorted to. That face of the semiconductor element 11 in which the bonding pads are disposed is adsorbed by a semiconductor element-adsorbing jig called "collet." While vibrating the collet, the semiconductor element 11 is bonded onto the heated surface of the tab 12 on which a gold foil 30 is deposited. Since the semiconductor element 11 is made of silicon, it forms a eutectic alloy with the gold foil and is perfectly bonded onto the surface of the tab 12.

Subsequently, the aluminum bonding pads $P_1$, $P_2$ . . . of the semiconductor element 11 and the ends of the leads 14 closer to the tab 12 are respectively connected by the Au wires $W_1$, $W_2$ . . . .

Thereafter, the resin such as epoxy resin is poured in the direction of arrow C. Then, the leads 14, the tab 12, the tab leads 13, the Au wires $w_1$, $w_2$ . . . and the semiconductor element 11 which exist inside the dam pieces 15 are perfectly protected by the resin. A one-dot chain line 17 indicates a molding portion formed of the resin. As clearly seen from FIG. 4, the corner of the molding portion 17 intersecting with the tab lead 13 is molded in a manner to have a cutaway face 18 which orthogonally intersects with the tab lead 13. This takes account of preventing the corner parts of the molding portion from being cut by a lead cutter when the tab leads are cut at their roots afterwards.

As hatched in FIG. 3, the dam pieces 15 and the end parts 31 of the leads 14 remote from the tab 12 are cut off. Since the tab leads 13 are not separated from the frame portion 10, the semiconductor device comprising the molding portion 17 and the plurality of separated leads 14 is supported by the frame portion 10 through the tab leads 13.

The semiconductor device under this state has its electrical characteristics tested, and marks indicative of grade etc. are printed on the upper surface of the molding portion 17.

Thereafter, the semiconductor device is separated from the frame portion 10 of the lead frame by cutting the tab leads 13 at the corners 18 of the molding portion.

In this way, the semiconductor device having flat leads 14 is obtained from the lead frame shown in FIG. 2. In case of fabricating deal-in-line type semiconductor devices in such a way that the leads 14 protruding long from the molding portion 17 are bent halfway, the bending of the leads 14 is carried out simultaneously with the cutting of the tab leads 13.

According to the lead frame of the embodiment described above, the following effects are expected:

(A) The rectangular tab 12 for mounting the semiconductor element 11 thereon is supported by the four tab leads 13 which extend along the diagonal lines of the tab 12. Therefore, this tab 12 is difficult to move and incline and exhibits an excellent rigidity. Accordingly, the ensuing advantages are brought forth;

(1) In automatically attaching the semiconductor element 11 to the tab 12, the location of the semiconductor element 11 relative to the tab 12 is reliably executed. Therefore, the bonding of the wires $w_1$, $w_2$ . . . for connecting the bonding pads $P_1$, $P_2$ . . . of the semiconductor element 11 and the leads 14 is also executed reliably. That is, even in case of a semiconductor device which has a plurality of proximate leads, the automation of the mounting of the semiconductor element 11 (pellet bonding) as well as the wire bonding is very easy with the lead frame structure as in this invention.

(2) In attaching the semiconductor element 11 to the tab 12 by rubbing with the semiconductor element-adsorbing jig, the tab does not swing. Accordingly, the semiconductor element 11 and the tab 12 are perfectly bonded. This solves the problem that cracks appear in the semiconductor element.

(3) Since the resin is poured from the vicinity of one tab lead 13 as indicated by the arrow C in FIG. 3, the tab 12 never slants. Accordingly, it does not occur that an intense force will act on the wire to break the wire or to bring the wires into contact.

(4) During the resin molding, the tab does not incline due to the inflowing resin, and vortices attributed to the shade of the flow do not develop, either. Therefore, no air bubble appears in the interior of the molding portion 17 or in the surface thereof. In consequence, even when the resin is made thin, an excellent semiconductor device is produced without lowering the moisture-resistance or spoiling the exterior view.

(B) The holes $L_1$, $L_2$, $L_3$, $M_1$, $M_2$, $M_3$ and $M_4$ are provided in the vicinities of the ends of the tab leads 13 and the leads 14 remote from the tab 12. Accordingly, the ensuing advantage is brought forth.

During the hardening of the resin, the frame portion 10 of the lead frame can be prevented from being drawn towards the tab 12 existent in the central part of the lead frame. Therefore, neither a crook nor a warp develops in the lead frame, and the location or transfer with the guide holes 16 of the lead frame is not rendered difficult.

(C) After the dam pieces 15 and the other-end parts 31 of the leads 14 have been cut, the semiconductor device is supported by the frame portion 10 through the tab leads 13. Accordingly, the ensuing advantages are brought forth;

(1) In case of subjecting the individual semiconductor devices to the tests of electrical characteristics and to the marking, the transfer with the guide holes 16 of the lead frames is possible. That is, the tests and marking of the semiconductor devices can be continuously dealt with, and the job efficiency is sharply enhanced.

(2) The plurality of semiconductor devices are handled under the state under which they are regularly arrayed on the single sheet of lead frames. Therefore, the semiconductor devices do not get entangled with each other. The breaking of the leads, etc. do not occur, either.

(3) The plurality of semiconductor devices can be transported by carrying the frame portion 10 of the lead frame. Therefore, the leads are not directly touched. Accordingly, the breaking of the leads, etc. do not occur. Especially in case where the molded semiconductor element is composed of a plurality of MOS transistors liable to electrostatic breakdown, the electrostatic breakdown of these MOS transistors is preventable.

Now, modifications of this invention will be described.

Figure 4:
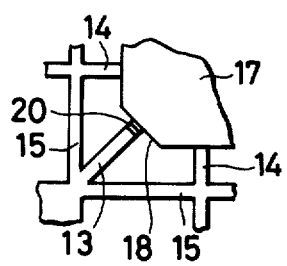
FIGS. 4 and 5 are enlarged fragmentary views of the semiconductor device of this invention.

(a) As shown in FIG. 4, a V-shaped groove 20 is provided in the tab lead 13.

Owing to the provision of the groove 20 in the tab lead 13, the tab lead can be simply cut at the groove in the step of cutting the tab lead.

In addition, owing to the groove 20, the tab lead can be prevented from coming out in the step of cutting the tab lead. That is, the tab lead 13 can be simply cut at the groove 20 without being intensely pulled by the lead cutter in the cutting step.

In the absence of such groove 20, the tab lead is liable to fall off in the step of cutting the tab lead, and a semiconductor device of high reliability will not be obtained on account of an inferior moisture-resistance. More specifically, as seen from FIG. 2, the tab lead 13 extends straight from the tab 12, and the width of the tab lead 13 is very small in the joint between the tab 12 and the tab lead 13. Accordingly, when the tab lead 13 is pulled in the cutting step, there is the possibility that the joint will snap to cause the falling-off of the tab lead and to degrade the moisture resistance. Even when the joint does not snap, the tab lead 13 is pulled to a considerable extent, and there is the possibility that a vacant space will appear between the tab lead and the resin to degrade the moisture resistance.

Figure 5:
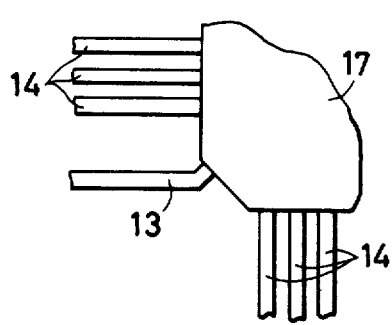

(b) At least one of the plurality of tab leads may well be used as an earth lead. As illustrated in FIG. 5, the tab lead 13 is extended in parallel with the leads 14. This tab lead 13 is employed as the earth lead.

(c) In the foregoing embodiment, the corner of the molding portion 17 has the cutaway face 18 as shown in FIG. 4. In order to obtain such chamfered structure, a mold for the resin corresponding to the structure must be used. The mold is expensive because the formation of the mold is extraordinarily difficult.

It is desirable to make the molding possible by the use of a mold which is inexpensive.

Figure 7:
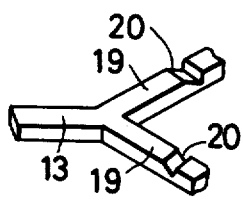
FIG. 7 is an enlarged fragmentary perspective view of a tab lead in the lead frame shown in FIG. 6, FIGS. 8 and 9 are schematic views for explaining the separation between a semiconductor device employing the lead frame shown in FIG. 6 and a frame portion of the lead frame.
Figure 6:
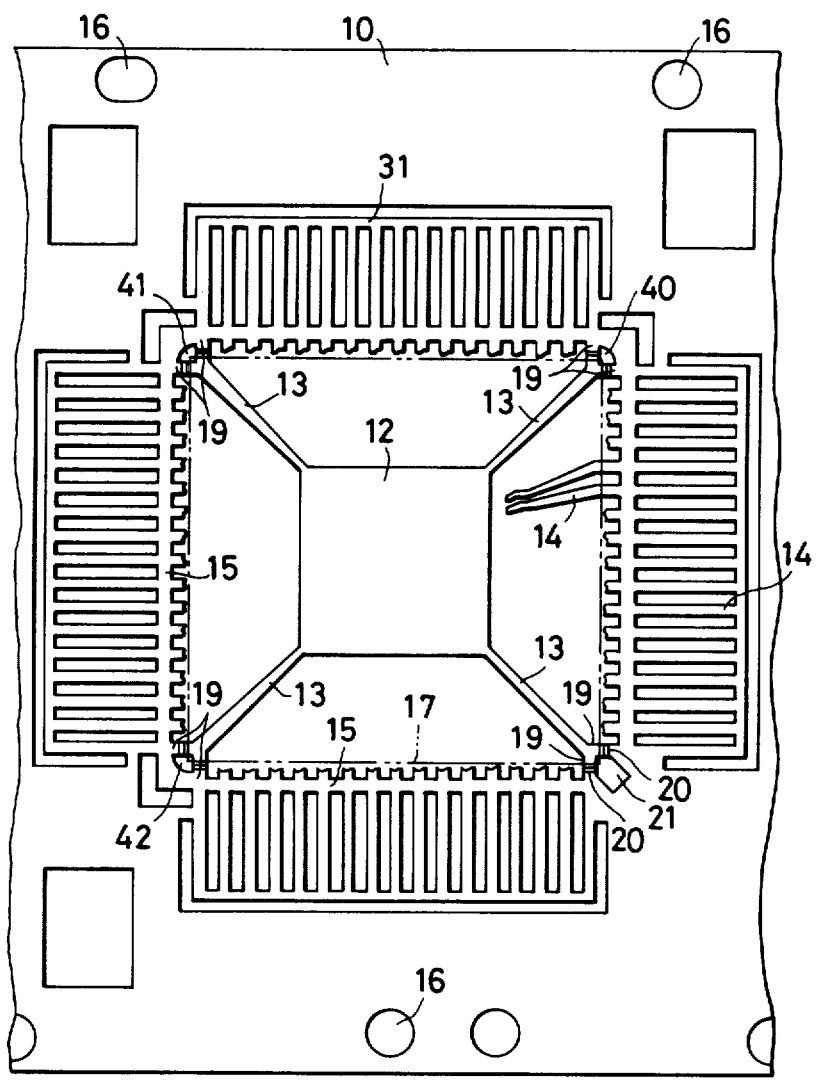
FIG. 6 is a plan view of another embodiment of the lead frame of this invention.

A lead frame shown in FIG. 6 is suitable for a structure in which the corners of the molding portion are not chamfered. This modification is such that each of the tab leads 13 is provided with two Y-shaped branch leads 19 in the vicinity of the frame portion 10. FIG. 7 shows an enlarged perspective view of the tab lead 13 which has the two branch leads 19. In FIGS. 6 and 7, V-shaped grooves 20 provided in the branch leads 19 serve to facilitate the separation between the tab lead 13 and the frame portion 10 likewise to the foregoing grooves.

Figure 8:
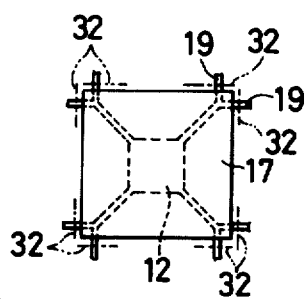

In this lead frame, the molding portion is formed as indicated by a one-dot chain line 17 in FIG. 6. The branch leads 19 are cut as indicated by two-dot chain lines 32 in FIG. 8. That is, the branch leads 19 are cut away from the frame portion 10 at the V-shaped grooves 20 thereof. Although the semiconductor element and the wires are not shown in FIG. 6, they are disposed on the lead frame as in FIG. 3.

In the lead frame having such tab leads, accordingly, the corner parts of the molding portion are not cut by the lead cutter in the step of cutting the tab leads.

Figure 9:
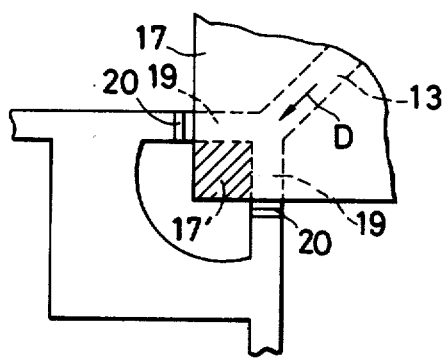

According to the modified embodiment of this invention provided with the branch leads 19, it can be more expected to prevent the tab leads from falling off. As shown in detail in FIG. 9, a molding part 17' exists between the two branch leads 19. This molding part 17' checks the tab lead 13 from being pulled towards the frame portion 10 (in the direction of arrow D) in the step of cutting the branch leads 19. Accordingly, the falling-off of the tab lead is perfectly prevented. Consequently, a semiconductor device of high moisture-resistance is manufactured.

In particular, with this lead frame, a resin pouring gate portion is improved.

Referring to FIG. 6, the resin flows in towards the tab 12 through a resin pouring portion 21. That space (hole) in the resin pouring gate portion 21 which is enclosed with the branch leads 19 and the frame portion 10 is formed to be larger than the other spaces (holes) 40, 41 and 42. Accordingly, the resin flows in towards the tab 12 sufficiently. This solves the problems of the exposure of the semiconductor element or the wire, etc. ascribable to insufficient inflow of the resin. This point will now be explained with reference to FIG. 10 being an enlarged plan of the resin pouring portion 21 and FIG. 11 being a section taken along A—A in FIG. 10.

Figure 10:
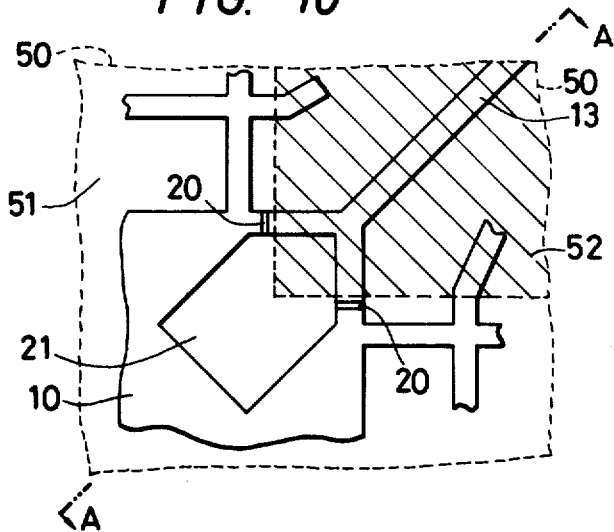
FIG. 10 is an enlarged plan view of a resin injecting portion in the lead frame shown in FIG. 6.

As shown in FIG. 10, a resin molding flask indicated at 50 and 50' has a part 51 lying in close contact with the lead frame and a space 52 not lying in close contact with the lead frame. The resin flows into the space 52 through the resin pouring portion 21, to form the molding portion of the semiconductor device. The reason why the resin flows into the space 52 sufficiently is that, as seen from FIG. 11, the frame portion 10 of the lead frame does not exist in a resin pouring port 54 of the molds 50 and 50'. That is, the lead frame is held between the molds 50 and 50' in such a manner that the resin pouring port 54 lies at the resin pouring portion (hole) 21 of the lead frame.

In case where the frame portion of the lead frame exists at the resin pouring port 54 as indicated by dotted lines 10', the width $w_1$ of the resin pouring port 54 becomes smaller by the thickness of the lead frame. Accordingly, the resin (17) does not sufficiently flow into the space 52. In order to cause the resin (17) to flow into the space 52 sufficiently, the width $w_1$ of the resin pouring port 54 may be made greater in consideration of the thickness of the lead frame. In this case, however, it is difficult to fabricate a semiconductor device having a thin molding portion.

Figure 11:
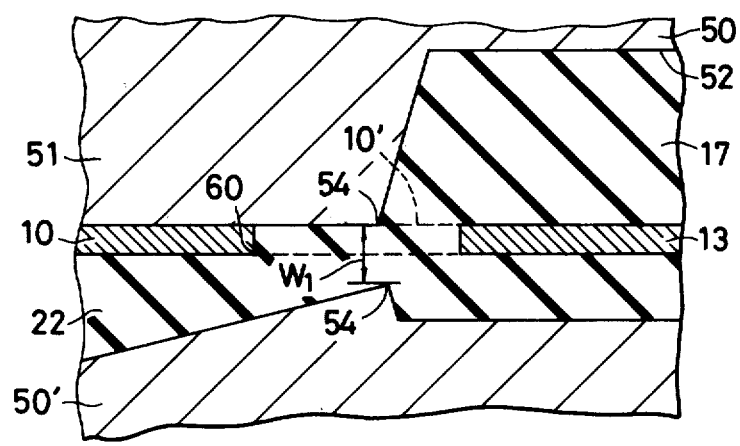
FIG. 11 is a sectional view taken along plane A—A in FIG. 10.

Further, a stepped part 60 is formed in a runner 22 as illustrated in FIG. 11. Therefore, when the molding portion and the runner are to be separated, a stress concentration acts on the stepped part 60. Thus, the molding portion and the runner 22 are separated in the stepped part 60. As a result, the shapes of runner separation parts in molded articles become uniform, and the drawback of irregular separation parts is preventable.

In the embodiments of this invention described above, the four tab leads radially extend from the tab to the frame portion of the lead frame. This is because the tab has the four-cornered shape. The fundamental technical idea of this invention, however, is not restricted thereto but consists in that at least three tab leads extend from the tab towards the frame portion of the lead frame. By way of example, in case of a circular tab, the tab can be supported by the frame portion of the lead frame through three tab leads.

What is claimed is:

1. In a lead frame of a metal sheet having a supporting member in the shape of a quadrangle for supporting a semiconductor element thereon, four supporting leads each serving to support said supporting member at one end thereof, a plurality of connecting leads each having one end protruded towards a peripheral edge of said supporting member, and a frame portion serving to support the other ends of said supporting and connecting leads, the improvements wherein said four supporting leads respectively extend from four corners of said quadrangular supporting member to said frame portion in respective directions extending outside said supporting member along lines each of which extends from the center portion of said supporting member to respective corners of said quadrangle thereof, and wherein said connecting leads extend from said frame portion towards respective ones of four peripheral edges of said quadrangular supporting member.

2. A lead frame according to claim 1, wherein the plurality of connecting leads corresponding to each side of said member are supported by a first band.

3. A lead frame according to claim 2, wherein the plurality of connecting leads corresponding to each side of said member have the other ends connected to said frame portion through by a second band.

4. A lead frame according to claim 1, wherein each of said supporting leads has a groove at the other end thereof.

5. A lead frame according to claim 4, wherein said groove is V-shaped.

6. A lead frame according to claim 1, wherein the other end of each of said supporting leads is connected to said frame portion by two branch leads.

7. A lead frame according to claim 6, wherein each of said branch leads has a groove.

8. A lead frame according to claim 7, wherein said groove is V-shaped.

9. A semiconductor device comprising a semiconductor element-supporting quadrangular member which has a semiconductor element fixed on its major surface, a molding portion which is made up of a resin covering said member and said semiconductor element, four supporting leads which extend from four corners of said member towards a peripheral surface of said molding portion in respective directions extending outside said member along lines each of which extends from the center portion of said member to respective corners of said quandrangle thereof, a plurality of terminals one end of each of which extends to the vicinity of a peripheral edge of said member inside said molding portion and the other end of each of which protrudes out of said molding portion, and a plurality of wires which lie inside said molding portion and each of which connects one end of the corresponding terminal and an electrode of said semiconductor element.

10. A semiconductor device according to claim 9, wherein the member supporting lead and said peripheral surface of said molding portion intersect substantially orthogonally.

11. In a semiconductor device having a quadrangular tab which has a semiconductor element fixed on its major surface, and a quadrangular molding portion which covers said tab and said semiconductor element, a semiconductor device characterized in that said tab comprises four tab leads which extend from four corners of said tab towards four corners of said molding portion respectively in respective directions extending outside said supporting member along lines each of which extends from the center portion of said supporting member to respective center portions of said quadrangle thereof, and each of which is branched into two parts halfway, the branched parts of said each tab lead extending in a manner to respectively intersect with sides of said molding portion orthogonal to each other.

12. A lead frame according to claim 1, wherein a plurality of said connecting leads are provided along each of said four peripheral edges between each respective supporting lead.

13. A semiconductor device according to claim 9, wherein a plurality of terminals and a plurality of wires are provided along each of four peripheral edges between each respective supporting lead.

14. In a lead frame of a metal sheet having a supporting member in the shape of a quadrangle for supporting a semiconductor element thereon, four supporting leads each serving to support said supporting member at one end thereof, a plurality of connecting leads each having its one end protruded towards a peripheral edge of said supporting member, and a frame portion serving to support the other ends of said supporting and connecting leads, the improvements wherein said four supporting leads respectively extending from four corners of said quadrangular supporting member to said frame portion in respective directions extending outside said supporting member along lines each of which extends from the center portion of said supporting member to respective corners of said quadrangle thereof to provide secure tilt-free support for the supporting member during operations of securing a semiconductor element to the supporting member and subsequently molding a resin around said supporting member, said supporting leads and said connecting leads, and wherein a plurality of said connecting leads extend from said frame portion towards each respective one of four peripheral edges of said quadrangular supporting member between each of said supporting leads so that substantially the entire peripheral edge portion of each respective peripheral edge can be used for adjacency to said connecting leads without interference from said supporting leads.

15. A lead frame according to claim 1, wherein holes are provided in said frame portion adjacent the ends of said supporting leads and the connecting leads attached to the frame portion to prevent the frame portion from being drawn toward said supporting member during the resin molding operation.

* * * * *